United States Patent [19]

Svetanoff

[11] Patent Number: 4,897,618

[45] Date of Patent: Jan. 30, 1990

[54] HARMONIC FREQUENCY SELECTING CIRCUIT

[75] Inventor: Dale G. Svetanoff, Arlington Heights, Ill.

[73] Assignee: The Curran Company, Glendale Heights, Ill.

[21] Appl. No.: 361,948

[22] Filed: Jun. 5, 1989

[51] Int. Cl.$^4$ .............................................. H03B 1/00
[52] U.S. Cl. ......................................... 331/76; 331/77
[58] Field of Search ............... 331/76, 77, 116 R, 158; 332/26

[56] References Cited

U.S. PATENT DOCUMENTS 4,258,436 3/1981 Campbell ........................... 331/76 X
4,723,113 2/1988 Marcoux ................................ 331/76

Primary Examiner—Eugene R. LaRoche
Assistant Examiner—Robert J. Pascal
Attorney, Agent, or Firm—Mason, Kolehmainen, Rathburn & Wyss

[57] ABSTRACT

A harmonic frequency selecting circuit is provided that simply and effectively provides a desired harmonic frequency output signal and that eliminates the need for frequency multiplier circuits. The harmonic frequency selecting circuit includes an oscillator circuit for generating a fundamental frequency signal and a plurality of harmonic frequency signals of the fundamental frequency signal. A phase modulator circuit is coupled to the oscillator circuit for selectively variably attenuating the generated fundamental and harmonic frequency signals. A bandpass filter circuit is coupled to the phase modulator circuit for selecting a predetermined harmonic frequency output signal.

20 Claims, 1 Drawing Sheet

HARMONIC FREQUENCY SELECTING CIRCUIT

BACKGROUND OF THE INVENTION

1. Field of the Invention

The present invention relates generally to radio frequency (RF) oscillators, and more particularly to RF oscillator harmonic frequency selecting circuitry.

2. Description of the Prior Art

Crystal oscillators typically are used for precision frequency control in oscillator circuits. The fundamental frequency of oscillation depends on the thickness of the crystal and its mode of oscillation. Crystal thickness is inversely related to the fundamental frequency so that the upper limit of operation for a crystal is determined by the minimum thickness possible without being so fragile that the crystal fractures. Due to the inherent physical limitations of crystal oscillators, a selected harmonic frequency of a fundamental oscillator frequency often is used for various high frequency applications. For example, to obtain a 920 MHz signal, the eighth harmonic frequency of a crystal oscillator rated at 115 MHz can be used.

Known harmonic frequency generating circuitry typically includes at least one frequency multiplier circuit and often several frequency multiplier stages in conjunction with an RF oscillator and a tuned circuit tuned to the fundamental frequency of the RF oscillator. Typically the tuned circuit provides a low level fundamental frequency output signal sufficient to drive a frequency multiplier. Inherent disadvantages resulting from such use of frequency multiplier circuits are the complexity and expense. Another disadvantage is that frequency multiplier circuits are difficult and time-consuming to adjust.

SUMMARY OF THE INVENTION

A principal object of the present invention is to provide an RF oscillator harmonic frequency selecting circuit that overcomes many of the disadvantages of the prior art systems. Other objects are to provide an RF oscillator harmonic frequency selecting circuit enabling efficient and reliable operation; to provide such RF oscillator harmonic frequency selecting circuit for simply and effectively providing a desired harmonic frequency output signal and that eliminates the need for frequency multiplier circuits.

In brief, the objects and advantages of the present invention are achieved by a harmonic frequency selecting circuit comprising an oscillator circuit for generating a fundamental frequency signal and a plurality of harmonic frequency signals of the fundamental frequency signal. A phase modulator circuit is coupled to the oscillator circuit for selectively variably attenuating the generated fundamental and harmonic frequency signals. A bandpass filter circuit is coupled to the phase modulator circuit for selecting a predetermined harmonic frequency output signal.

In accordance with a feature of the invention, the phase modulator circuit effectively provides resonant tuning for selectively tuning a predetermined harmonic frequency signal and providing sufficient attenuation for rejecting the generated fundamental and at least predefined ones of the harmonic frequency signals.

BRIEF DESCRIPTION OF THE DRAWINGS

The present invention together with the above and other objects and advantages may best be understood from the following detailed description of the embodiment of the invention illustrated in the drawings, wherein.

DETAILED DESCRIPTION OF THE PREFERRED EMBODIMENT

Figure 1:
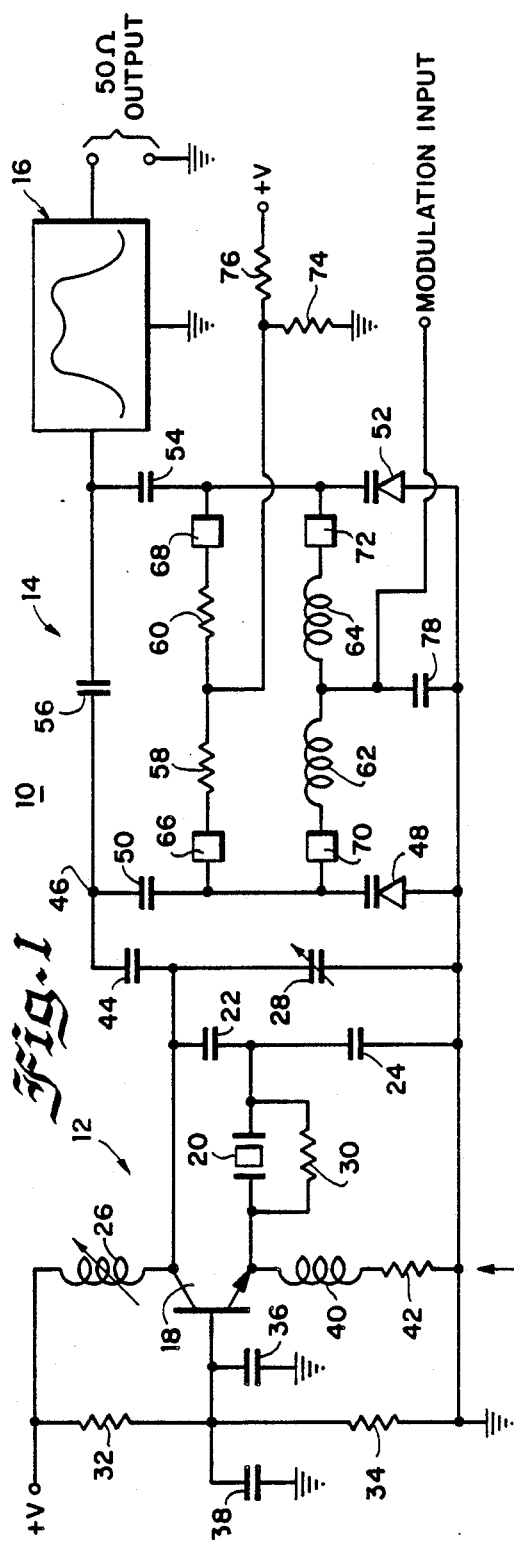
FIG. 1 is an electrical schematic diagram representation of a harmonic frequency selecting circuit according to the present invention.

Referring now to the drawings, in FIG. 1 there is illustrated a harmonic frequency selecting circuit according to the present invention generally designated by the reference numeral 10. As its major components, the harmonic frequency selecting circuit 10 includes an oscillator circuit 12 for generating a fundamental frequency signal and a plurality of harmonic frequency signals of the fundamental frequency signal, a phase modulator circuit 14 adapted for selectively variably attenuating the generated oscillator fundamental and harmonic frequency signals, and a bandpass filter 16 for providing a desired harmonic frequency output signal. A particular selected harmonic frequency output signal of the bandpass filter 16 has a sufficient output level for simplified direct amplification to a desired power level or other direct signal processing, while eliminating the need for conventional frequency multiplier stages to provide a carrier signal.

Oscillator circuit 12 is configured for effectively generating harmonic frequency signals of the fundamental frequency signal. Oscillator circuit 12 includes a single stage NPN transistor 18. A crystal 20 is connected between the emitter of the transistor 18 and the junction of a pair of series-connected capacitors 22 and 24. Capacitors 22 and 24 connected between the collector of the transistor 18 and ground provide necessary phase-shift to permit oscillation.

Various commercially available transistor devices having a high current gain and high frequency response characteristics, such as, a device type 2N5179, can be used for the transistor 18. The crystal 20 has a high fundamental frequency of operation, such as, for example, in the range between 112.75 MHz and 116.00 MHz. A precision crystal, such as, a seventh-overtone series mode type, rated for resonant fundamental oscillation frequency between 112.75 MHz and 116.00 MHz manufactured and sold by Sentry Manufacturing Co. of Chickasha, Oklahoma can be used for the crystal 20. A capacitance value of 4.7pF (picofarad) and 20pF can be used for capacitors 22 and 24, respectively.

A resonant combination of a variable inductor 26 and a variable capacitor 28 are coupled in series with the crystal 20. Inductor 26 is connected between the collector of transistor 18 and a positive power supply +V. Capacitor 28 is connected between the collector of transistor 18 and a DC ground potential. A variable capacitor rated between 2.5–10pF (picofarad) can be used for variable capacitor 28 with an inductance value of about 0.108µH (microhenry) for the inductor 26.

A resistor 30, such as a 1KΩ resistor, is connected in parallel with the crystal 20 to provide frequency range adjustment by lowering the effective quality factor Q of the crystal and to facilitate effective oscillation start-up. A biasing combination of a pair of series connected resistors 32 and 34 and a pair of parallel connected capacitors 36 and 38 is connected to the base of the transistor 18, as shown. Exemplary values of resistors 32 and 34 and capacitors 36 and 38 include 10KΩ and 3KΩ and 0.01pF and 33 pF, respectively.

An inductor 40 is connected in series with a current limiting resistor 42 between the emitter of the transistor 18 and ground. A 100Ω resistor can be used for the current limiting resistor 42. Inductor 40 compensates for excess trace capacitance on a circuit board (not shown) carrying the circuit 10 and provides crystal frequently range adjustment and modulation sideband symmetry. A single turn #22 gauge coil can be used for the inductor 40. A coupling capacitor 44, such as, a 4.7pF capacitance value, couples the output signals of oscillator 12 to an input node 46 of the phase modulator circuit 14.

Phase modulator circuit 14 provides phase shift modulation and resonant tuning for selectively variably attenuating the generated oscillator fundamental and harmonic frequency signals. Phase modulator circuit 14 includes first and second parallel resonant circuits formed by a first series connected voltage-variable capacitance (varicap) diode 48 and a capacitor 50 and a second series connected varicap diode 52 and a capacitor 54 connected together via a resonant coupling capacitor 56. A pair of series-connected resistors 58 and 60 and a pair of series-connected inductors 62 and 64 are connected between the junctions of the first and second series connected varicap diodes and capacitors 48, 50 and 52, 54. An RF (radio frequency) choke is provided by mounting a respective ferrite bead 66, 68, 70 and 72 on the component leads of the resistors 58, 60 and inductors 62, 64, as shown. Ferrite beads 66, 68, 70 and 72 decouple stray component capacitance to ground and can be provided by a ferrite bead device type FB-64-101 manufactured and sold by Amidon Associates, of North Hollywood, California.

Inherent lead inductance of the capacitors 56, 50 and 54 facilitates resonant operation of the phase modulator circuit 14 so that leadless chip-style devices advantageously are not used for the capacitors 56, 50 and 54. A ratio of the capacitance values of capacitor 56 relative to capacitors 50 and 54 determines the degree of phase shift for modulation. An approximate capacitance ratio of 25:1 provides effective phase angle modulation. Capacitors 50 and 54 are provided with substantially identical capacitance values for symmetrical modulation.

In accordance with an important feature of the invention, a desired harmonic frequency output signal of the phase modulator circuit 14 is effectively determined by a particular selected component value of the capacitor 56. Typical values of 1pF for capacitor 56 and 27pF for capacitors 50 and 54 can be employed to provide a modulation index capability of approximately 1 to 5 and a desired resonant coupling frequency signal of the eighth harmonic ($8F_0$) of the fundamental oscillator frequency.

A voltage-variable capacitance diode providing at a reverse voltage of 4.0 volts, a diode capacitance in a range between 6.1–7.5pF measured at 1.0 MHz and a figure of merit Q of approximately 450 measured at 50.0 MHz, such as, a device type MV2101 manufactured and sold by Motorola, Inc. can be used for varicap diodes 48 and 52. An exemplary value for resistors 58 and 60 is 82kΩ. An inductance value of approximately 1μH can be used for inductors 62 and 64.

A voltage divider combination of a pair of resistors 74 and 76, such as a 33kΩ resistor 74 and a 47kΩ resistor 76, is connected in series between the voltage supply +V and ground and is connected at its junction to the junction of the series-connected resistors 58 and 60. A DC bias voltage provided at the junction of resistors 74 and 76 is applied to the varicap diodes 48 and 52 via resistors 58, 60, respectively.

A modulation input signal is applied to the junction of the series-connected inductors 62, 64. Typically the modulation input signal is an audio signal having a frequency in a range between 300–3000Hz. A capacitor 78, such as a 330pF capacitance value, is connected between the junction of the series-connected inductors 62, 64 and ground, effectively providing an RF ground for stable circuit operation.

The bandpass filter 16 is adapted to pass high frequency signals in a predetermined frequency band centered on a corresponding frequency to provide the desired harmonic frequency signal output at its output indicated as 50Ω OUTPUT. Various commercially available filters having a desired center frequency and bandwidth and providing a low insertion loss, such as, helical filters for communication equipment manufactured and sold by Toko America Inc. of Mt. Prospect, Illinois, can be used for the bandpass filter 16. Alternatively, the bandpass filter 16 can be formed using conventional printed circuit board (PC) microstrip techniques.

Figure 2:
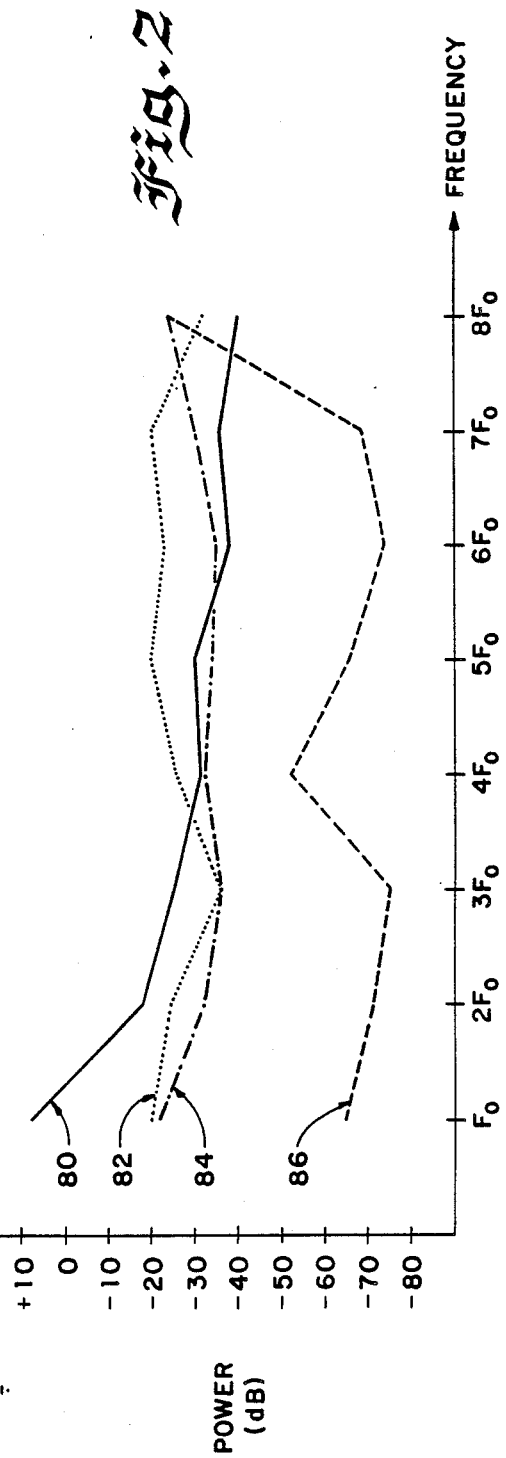
FIG. 2 illustrates exemplary signal amplitude versus frequency charts of both component portions of and the overall harmonic frequency selecting circuit of FIG. 1.

FIG. 2 illustrates exemplary signal amplitude versus frequency response of the oscillator circuit 12 illustrated by a line labelled 80, of the phase modulator circuit 14 illustrated by a first dotted line 82 and a second dash/dotted line 84 and of the overall harmonic frequency selecting circuit 10 by a dashed line 86. The second dash/dotted line 84 illustrates the operation of the phase modulator circuit 14 utilizing alternative capacitance values for capacitors 50, 54 and 56. An alternative capacitance value of 50pF is used for the capacitors 50 and 54 and a multi-turn precision variable capacitor having a range of 0.8–4.0pF for the coupling capacitor 56. Adjustment of the variable coupling capacitor 56 to provide increasing capacitance values results in a reduction of the output level of the eighth harmonic $8F_0$ and an increase output level of the in each of the seventh harmonic ($7F_0$), sixth harmonic ($6F_0$) and fifth harmonic ($5F_0$). Thus, resonant tuning by the phase modulator circuit 14 to tune a particular harmonic frequency output signal is simply provided by changing the component value of the resonant coupling capacitor 56 with a corresponding ratio value for capacitors 50 and 54. The following Table I summaries the signal amplitude versus frequency response performance as illustrated in FIG. 2.

TABLE I

| FREQ. | OSCILLATOR (LINE 80) | PHASE MODULATOR 14 | | CIRCUIT 10 (LINE 86) |
|---|---|---|---|---|
| | | (LINE 82) | (LINE 84) | |
| $F_0$ | +8 | −22 | −20 | −65 |
| $2F_0$ | −18 | −32 | −24 | −71 |
| $3F_0$ | −25 | −36 | −36 | −75 |
| $4F_0$ | −31 | −32 | −26 | −52 |
| $5F_0$ | −30 | −34 | −20 | −66 |
| $6F_0$ | −38 | −35 | −23 | −74 |
| $7F_0$ | −36 | −30 | −20 | −69 |
| $8F_0$ | −40 | −24 | −32 | −24 |

While the invention has been described with reference to details of the illustrated embodiment, these details are not intended to limit the scope of the invention as defined in the appended claims.

I claim:

1. A harmonic frequency selecting circuit comprising:
   oscillator means for generating a fundamental frequency signal and a plurality of harmonic frequency signals of said fundamental frequency signal;
   phase modulator means coupled to said oscillator means for selectively variably attenuating said generated frequency signals; and
   bandpass filter means coupled to said phase modulator means for selecting a predetermined harmonic frequency output signal.

2. A harmonic frequency selecting circuit as recited in claim 1 wherein said oscillator means include a single transistor stage, a series coupled combination of at least one crystal, inductor and capacitor.

3. A harmonic frequency selecting circuit as recited in claim 2 wherein said crystal is rated for resonant fundamental oscillation frequency in a range between 112 MHz and 116 MHz.

4. A harmonic frequency selecting circuit as recited in claim 2 wherein said capacitor is a variable capacitor rated between 2.5–10pF.

5. A harmonic frequency selecting circuit as recited in claim 4 wherein said inductor has an inductance value of approximately 0.108μH.

6. A harmonic frequency selecting circuit as recited in claim 1 wherein said oscillator means include a transistor, a crystal coupled to the emitter of said transistor and a series resonant circuit with said crystal including at least one adjustable capacitance device.

7. A harmonic frequency selecting circuit as recited in claim 1 wherein said phase modulator means include a first resonant circuit, a second resonant circuit coupled in parallel with said first resonant circuit and a resonant coupling capacitor connected between said first and second resonant circuits.

8. A harmonic frequency selecting circuit as recited in claim 7 wherein said resonant coupling capacitor has a capacitance value selectively provided for variably attenuating said generated frequency signals.

9. A harmonic frequency selecting circuit as recited in claim 7 wherein each said first and second resonant circuits include a voltage-variable capacitance diode and a capacitor connected in series with said voltage-variable capacitance diode.

10. A harmonic frequency selecting circuit as recited in claim 9 further comprising a first inductor and a second inductor connected in series between a junction of said series connected voltage-variable capacitance diode and said capacitor of said first and second resonant circuits.

11. A harmonic frequency selecting circuit as recited in claim 10 wherein a modulation signal is applied to a junction of said first and second series connected inductors.

12. A harmonic frequency selecting circuit as recited in claim 9 further comprising a first resistor and a second resistor connected in series between a junction of said series connected voltage-variable capacitance diode and said capacitor of said first and second resonant circuits.

13. A harmonic frequency selecting circuit as recited in claim 12 wherein a biasing voltage signal is applied to a junction of said first and second series connected resistors.

14. A harmonic frequency selecting circuit as recited in claim 7 wherein said resonant coupling capacitor has a capacitance value of approximately 1pF and said first and second resonant circuits include a substantially equal capacitance value of approximately 27pF.

15. A harmonic frequency selecting circuit as recited in claim 7 wherein said resonant coupling capacitor has a variable capacitance value in a range between 0.8–4.0pF.

16. A harmonic frequency selecting circuit as recited in claim 7 wherein said resonant coupling capacitor includes leads and each said first and second resonant circuits include a capacitor having leads, said capacitor leads providing inherent lead inductance for resonant tuning operation.

17. A harmonic frequency selecting circuit comprising:
   oscillator means for generating a fundamental frequency signal and a plurality of harmonic frequency signals of said fundamental frequency signal, said oscillator means include a single stage transistor and a series resonant crystal;
   phase modulator means coupled to said oscillator means for selectively variably attenuating said generated frequency signals; and
   bandpass filter means coupled to said phase modulator means for selecting a predetermined harmonic frequency output signal.

18. A harmonic frequency selecting circuit as recited in claim 17 wherein said phase modulator means includes a first capacitor and a second capacitor coupled in parallel with said first capacitor and a third coupling capacitor connected between said first and second capacitors.

19. A harmonic frequency selecting circuit as recited in claim 18 wherein said first and second capacitors have a substantially identical capacitance value and have a capacitance ratio of approximately 25:1 with said third coupling capacitor.

20. A harmonic frequency selecting circuit comprising:
   crystal oscillator means for generating a fundamental frequency signal and a plurality of harmonic frequency signals of said fundamental frequency signal;
   phase modulator means coupled to said oscillator means for resonant tuning a predetermined harmonic frequency signal and for substantially attenuating predefined ones of said generated frequency signals; and
   bandpass filter means coupled to said phase modulator means for selectively passing said predetermined harmonic frequency signal, whereby a carrier signal is provided by said predetermined harmonic frequency signal eliminating frequency multiplier stages.

* * * * *